United States Patent
Tang et al.

(10) Patent No.: US 10,872,847 B2
(45) Date of Patent: Dec. 22, 2020

(54) PACKAGE STRUCTURE AND METHOD FOR FABRICATING THE SAME

(71) Applicant: Siliconware Precision Industries Co., Ltd., Taichung (TW)

(72) Inventors: Shao-Tzu Tang, Taichung (TW); Jia-Fong Yeh, Taiwan (TW); Yi-Hsuan Liu, Taichung (TW); Mei-Chi Chen, Taichung (TW); Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/720,552

(22) Filed: Sep. 29, 2017

(65) Prior Publication Data
US 2018/0342446 A1 Nov. 29, 2018

(30) Foreign Application Priority Data
May 25, 2017 (CN) .......................... 2017 1 0377478

(51) Int. Cl.
*H01L 23/02* (2006.01)
*H01L 23/495* (2006.01)
(Continued)

(52) U.S. Cl.
CPC ...... *H01L 23/49575* (2013.01); *H01L 21/565* (2013.01); *H01L 23/3107* (2013.01); *H01L 23/3121* (2013.01); *H01L 23/4952* (2013.01); *H01L 23/49811* (2013.01); *H01L 23/49833* (2013.01); *H01L 24/06* (2013.01); *H01L 24/24* (2013.01); *H01L 24/82* (2013.01); *H01L 21/4853* (2013.01); *H01L 23/5389* (2013.01); *H01L 2224/05601* (2013.01); *H01L 2224/24227* (2013.01); *H01L 2224/24247* (2013.01); *H01L 2224/32014* (2013.01); *H01L 2224/32145* (2013.01); *H01L 2224/32225* (2013.01); *H01L 2224/32245* (2013.01); *H01L 2224/73267* (2013.01); *H01L 2224/92244* (2013.01);
(Continued)

(58) Field of Classification Search
CPC .......... H01L 27/1462; H01L 2924/181; H01L 2224/73265; H01L 27/14618
USPC ................................ 257/678, 679, 680, 787
See application file for complete search history.

(56) References Cited

U.S. PATENT DOCUMENTS 7,015,579 B2 * 3/2006 Okada .................. G06K 9/0002
257/433
2004/0104458 A1 * 6/2004 Tsukada ................ G01L 19/141
257/669
(Continued)

*Primary Examiner* — S. V. Clark
(74) *Attorney, Agent, or Firm* — Mintz Levin Cohn Ferris Glovsky and Popeo, P.C.; Peter F. Corless; Steven M. Jensen

(57) ABSTRACT

A package structure and a method for fabricating the same are provided. An electronic component such as a sensing chip and a conductive element such as a bonding wire are mounted to a carrier, encapsulated by an encapsulant, and electrically connected through a conductive layer. As such, the electronic component can further be electrically connected to the carrier through the conductive layer and the conductive element. Therefore, the sensing chip can be packaged through current packaging processes, thereby reducing the fabrication cost, shortening the fabrication time and improving the product yield.

10 Claims, 5 Drawing Sheets

(51) Int. Cl.
    *H01L 23/498*     (2006.01)
    *H01L 21/56*     (2006.01)
    *H01L 23/00*     (2006.01)
    *H01L 23/31*     (2006.01)
    *H01L 23/538*     (2006.01)
    *H01L 21/48*     (2006.01)

(52) U.S. Cl.
    CPC ............ *H01L 2224/97* (2013.01); *H01L 2924/15313* (2013.01); *H01L 2924/1815* (2013.01); *H01L 2924/19107* (2013.01)

(56) References Cited

U.S. PATENT DOCUMENTS

| | | | |
|---|---|---|---|
| 2004/0159961 A1* | 8/2004 | Mensch | G06K 9/0002 257/787 |
| 2007/0222049 A1* | 9/2007 | Weng | G06K 9/0002 257/678 |
| 2008/0079100 A1* | 4/2008 | Manansala | G06K 9/00053 257/415 |
| 2009/0073632 A1* | 3/2009 | Yang | G06K 9/00026 361/220 |
| 2009/0184408 A1* | 7/2009 | Okada | G06K 9/0002 257/680 |
| 2012/0112764 A1* | 5/2012 | Goldenberg | H01L 21/56 324/629 |

\* cited by examiner

PACKAGE STRUCTURE AND METHOD FOR FABRICATING THE SAME

CROSS-REFERENCE TO RELATED APPLICATION

This application claims under 35 U.S.C. § 119(a) the benefit of Chinese Patent Application No. 201710377478.X filed May 25, 2017, the entire contents of which are incorporated herein by reference.

BACKGROUND

1. Technical Field

The present disclosure relates to semiconductor package structures, and, more particularly, to a sensor-type package structure.

2. Description of Related Art

Nowadays, as people are paying more and more attention on privacy protection, many high-end electronic products are equipped with user identification systems to improve data security. Therefore, research and development of identification systems are becoming increasingly important in electronic industries.

Generally, biological identification systems can identify physiological features such as fingerprints, pupils, faces and voiceprints, or identify behavioral features such as signatures or voices. Physiological feature identification systems have advantages of uniqueness, high security and convenience and therefore are widely accepted by consumers.

Further, as high-end electronic products are developed toward the trend of high integration, they are usually equipped with physiological feature identification devices such as fingerprint identification devices or face identification devices. Currently, fingerprint identification devices are the most widely used devices since such devices facilitate to meet the miniaturization requirement of electronic products. Fingerprint identification devices are divided into optical fingerprint identification devices that can optically scan fingerprint patterns and silicon fingerprint identification devices that can detect faint electrical charges in fingerprint patterns.

FIG. 1 is a schematic cross-sectional view of a conventional fingerprint sensing package structure 1. A plurality of through silicon vias (TSVs) 12 are formed corresponding in position to a plurality of electrode pads 100 that are disposed at an edge of a chip body 10. The TSVs 12 are formed by a dry etching process. A conductive layer 14 is formed in the TSVs 12 and extends to a lower side of the chip body 10. An insulating layer 13 is further formed on the conductive layer 14 to prevent a leakage from occurring between the TSVs 12. A portion of the conductive layer 14 is exposed from the insulating layer 13 to serve as electrical contacts. A solder material 15 is bonded to the electrical contacts.

However, since the TSVs 12 are positioned at the edge of the chip body 10 and the edge of the chip body 10 has a small thickness, cracking may occur to the TSVs 12.

Further, the dry etching process for forming the TSVs 12 and the process for forming the insulating layer 13 in the TSVs 12 complicate the fabrication process, increase the fabrication time and adversely affect the product yield.

Therefore, there is a need to provide a package structure and a fabrication method thereof so as to overcome the above-described drawbacks.

SUMMARY

In view of the above-described drawbacks, the present disclosure provides a package structure and a method for fabricating the same so as to reduce the fabrication cost, shorten the fabrication time and improve the product yield.

The package structure according to the present disclosure comprises: a carrier; an electronic component disposed on the carrier and having a sensing surface; at least one conductive element disposed on the carrier; an encapsulant formed on the carrier to encapsulate the electronic component and the conductive element, wherein the sensing surface of the electronic component and a portion of a surface of the conductive element are exposed from the encapsulant; and a conductive layer formed on the encapsulant and electrically connecting the conductive element and the electronic component.

The method for fabricating a package structure according to the present disclosure comprises the steps of: disposing at least one conductive element and an electronic component having a sensing surface on a carrier; forming on the carrier an encapsulant that encapsulates the electronic component and the conductive element, wherein the sensing surface of the electronic component and a portion of a surface of the conductive element are exposed from the encapsulant; and forming on the encapsulant a conductive layer that electrically connects the conductive element and the electronic component.

In an embodiment, the carrier is a circuit board or a lead frame.

In an embodiment, the electronic component is a fingerprint identification chip.

In an embodiment, the conductive element is a loop-type bonding wire or a wire segment.

In an embodiment, the conductive element is electrically connected to the carrier.

In an embodiment, an opening is formed in the encapsulant to expose the portion of the surface of the conductive element.

In an embodiment, the electronic component, the conductive element and the encapsulant are disposed on one side of the carrier, and a plurality of conductive pads are formed on the other opposite side of the carrier.

Therefore, since the conventional TSV is replaced with the conductive element, the present disclosure fabricates the package structure through current packaging processes, dispensing with the conventional TSV-related processes. As such, the present disclosure reduces the fabrication cost, shortens the fabrication time and improves the product yield.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "on", "a" etc. are merely for illustrative purposes and should not be construed to limit the scope of the present disclosure.

FIGS. 2A to 2E are schematic cross-sectional views showing a method for fabricating a package structure 2 according to the present disclosure.

Figure 1:
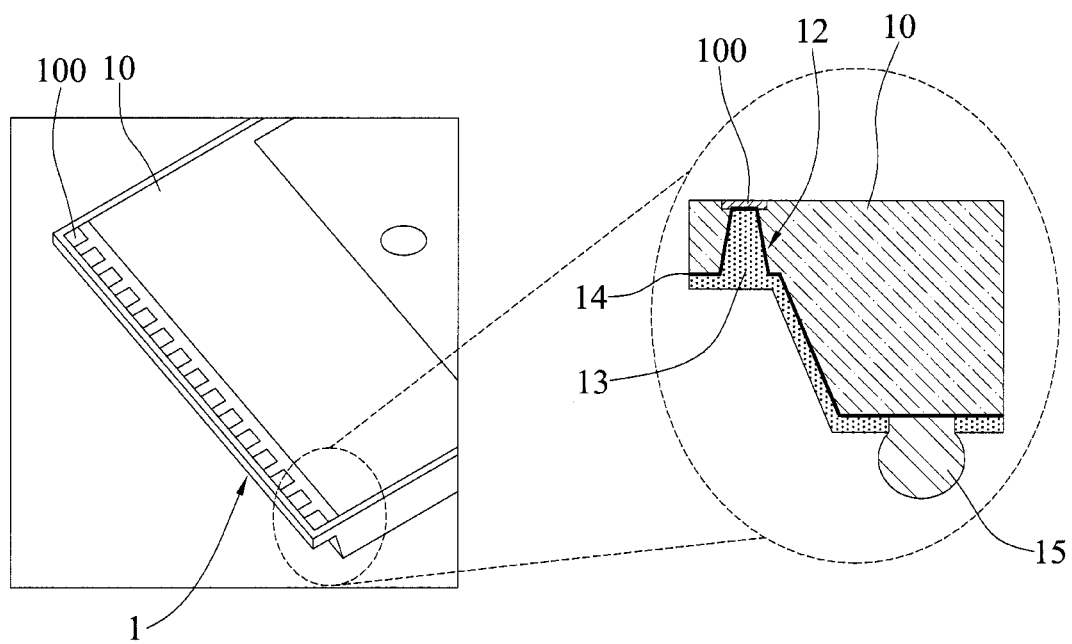
FIG. 1 is a schematic cross-sectional view of a conventional fingerprint sensing package structure.
Figure 2A:
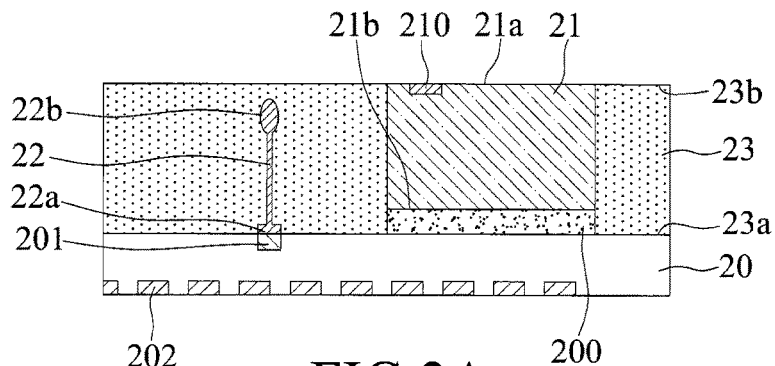
FIGS. 2A to 2E are schematic cross-sectional views showing a method for fabricating a package structure according to the present disclosure, wherein FIG. 2C' is a schematic perspective view of FIG. 2C, and FIG. 2E' is a schematic plan view of FIG. 2E.

Referring to FIG. 2A, an electronic component 21 is disposed on a carrier 20 and a plurality of conductive elements 22 are disposed on the carrier 20. Then, an encapsulant 23 is formed on the carrier 20 to encapsulate the electronic component 21 and the conductive elements 22.

In an embodiment, the carrier 20 is a circuit board, such as packaging substrate having circuits or a semiconductor board. The electronic component 21 is a sensing chip that is used to detect changes in electrical charges, temperature or pressure of a living organism. Preferably, the electronic component 21 is a fingerprint identification chip that performs a biological identification based on a capacitance difference received from a sensing area. The electronic component 21 has a sensing surface 21a with a plurality of electrode pads 210, and a non-sensing surface 21b opposite to the sensing surface 21a and bonded to the carrier 20 through an adhesive layer 200 such as an epoxy resin film.

The carrier 20 has a plurality of conductive pads 201 on an upper side thereof and a plurality of conductive pads 202 on a lower side thereof. The conductive pads 202 are used for connecting the carrier 20 to an electronic device (not shown), such as a circuit board, a package or the like. The conductive elements 22 are in contact with and bonded to the conductive pads 201 so as to be electrically connected to the carrier 20. Each of the conductive elements 22 is a bonding wire segment, one end 22a of which is bonded to the corresponding conductive pad 201 of the carrier 20. In an embodiment, at least one of the conductive pads 201 is electrically grounded for subsequently conducting electrostatic charges through internal circuits of the carrier 20 (not shown) and the conductive pads 202 to a circuit board (not shown) disposed on the lower side of the carrier 20.

In an embodiment, the encapsulant 23 is formed by molding on the carrier 20 to encapsulate the electronic component 21 and the conductive elements 22. The encapsulant 23 has a first surface 23a bonded to the carrier 20 and a second surface 23b opposite to the first surface 23a. The sensing surface 21a of the electronic component 21 is exposed from the second surface 23b of the encapsulant 23. In an embodiment, the sensing surface 21a of the electronic component 21 is flush with the second surface 23b of the encapsulant 23. In another embodiment, during the molding process, a film is attached to an upper mold to cover the electrode pads 210, thus preventing the encapsulant 23 from being formed on and covering the electrode pads 210. After the molding process, the upper mold is removed to expose the electrode pads 210.

Figure 2B:
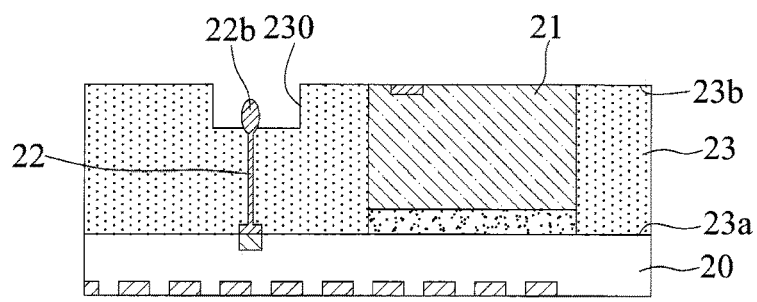

Referring to FIG. 2B, a plurality of openings 230 are formed on the second surface 23b of the encapsulant 23 to expose the other ends 22b of the conductive elements 22.

In an embodiment, the encapsulant 23 is already cured and therefore the openings 230 are formed by laser. Further, since a small number (for example, 18) of the fingerprint identification chip are provided, the laser process for forming the openings 230 has advantages of low fabrication cost and short fabrication time. If the cured encapsulant 23 is etched by an etching solution, a specific mask pattern and related processes such as exposure and development are required and the fabrication is difficult and not cost-effective.

Figure 2C:
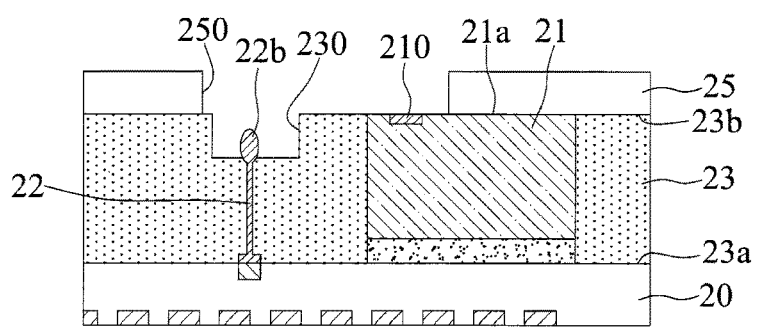
Figure 2C:
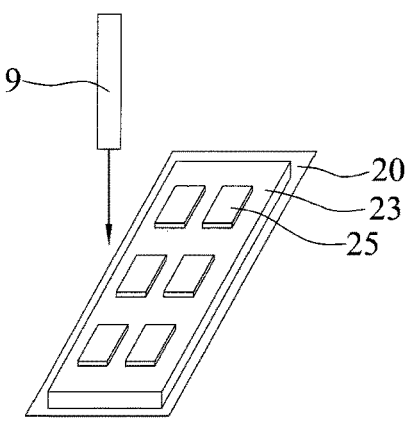

Referring to FIG. 2C, a resist layer 25 is formed on a portion of the second surface 23b of the encapsulant 23 and a portion of the sensing surface 21a of the electronic component 21, and a plurality of open areas 250 are formed in the resist layer 25 to expose the openings 230, the electrode pads 210 and the area between the openings 230 and the electrode pads 210.

In an embodiment, referring to FIG. 2C', the open areas 250 are formed by laser ablation 9.

Figure 2D:
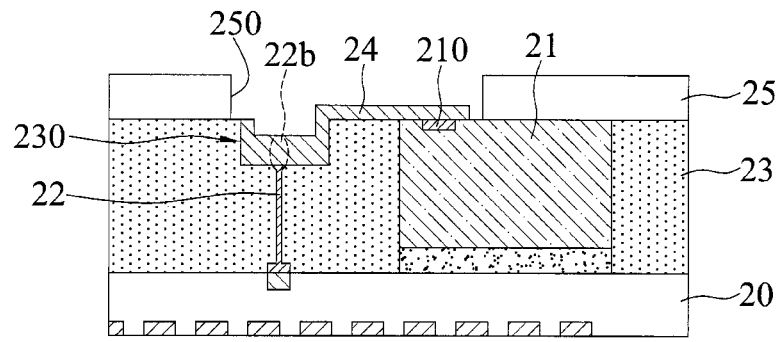

Referring to FIG. 2D, a conductive layer 24 is formed in the open areas 250 for electrically connecting the conductive elements 22 and the electrode pads 210 of the electronic component 21.

In an embodiment, the electronic component 21 is electrically connected to the carrier 20 through the conductive layer 24 and the conductive elements 22. In another embodiment, the conductive layer 24 is formed in the openings 230 so as to be in contact with the ends 22b of the conductive elements 22.

In an embodiment, the conductive layer 24 can be formed by electroplating, sputtering or depositing a metal material. In another embodiment, the conductive layer 24 has a stainless steel/copper/stainless steel structure. In yet another embodiment, a conductive adhesive such as silver adhesive can be filled in the open areas 250, heated and cured to serve as the conductive layer 24.

In an embodiment, the conductive layer 24 can extend from one of the openings 230 to the second surface 23b of the encapsulant 23. As such, the encapsulant 23 is grounded to the carrier 20 through the conductive layer 24 and the corresponding conductive element 22. Therefore, when a user presses the fingerprint sensor with his finger, the conductive layer 24 can conduct electrostatic charges of the finger. In an embodiment, the opening 230 can be filled with the conductive layer 24.

Figure 2E:
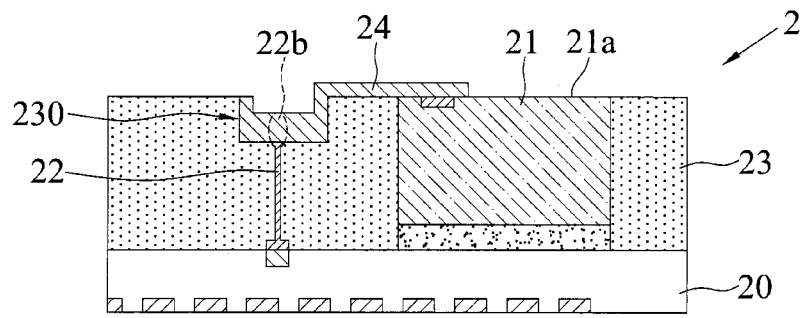
Figure 2E:
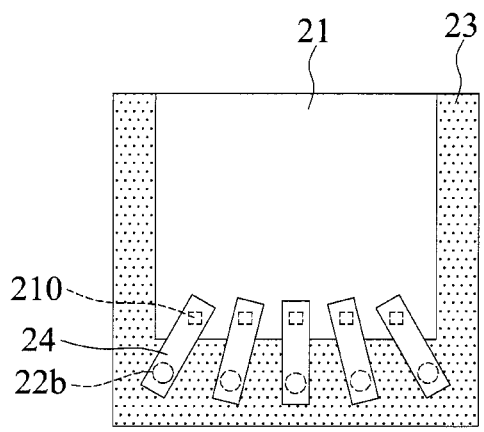

Referring to FIGS. 2E and 2E', the resist layer 25 is removed and a package structure 2 is obtained.

Figure 3A:
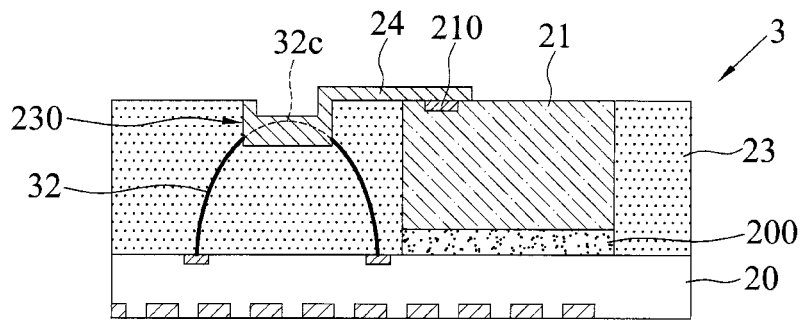
FIGS. 3A to 3C are schematic cross-sectional views showing other embodiments of FIG. 2E, wherein FIG. 3A' shows another embodiment of FIG. 3A.
Figure 3A:
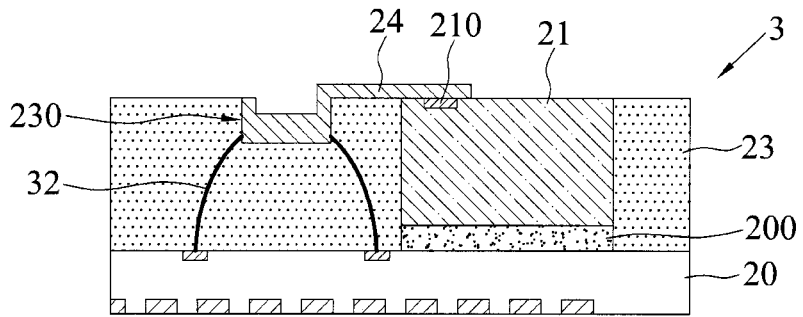

FIG. 3A is a schematic cross-sectional view of a package structure 3 according to another embodiment of the present disclosure. Referring to FIG. 3A, each of the conductive elements 32 is a loop-type bonding wire, and the conductive layer 24 is in contact with a loop top 32c of the conductive element 32. Alternatively, referring to FIG. 3A', when the opening 230 is formed by laser, the conductive element 32 is burned into two separate segments. Each of the segments has an end exposed from the opening 230 and in contact with the conductive layer 24. The conductive element 22, 32 can be a bump containing a solder material or copper, a metal post, or a metal frame.

Figure 3B:
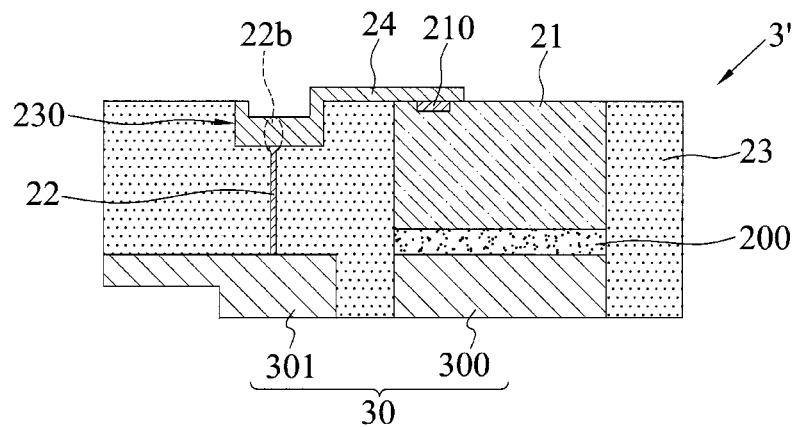
Figure 3C:
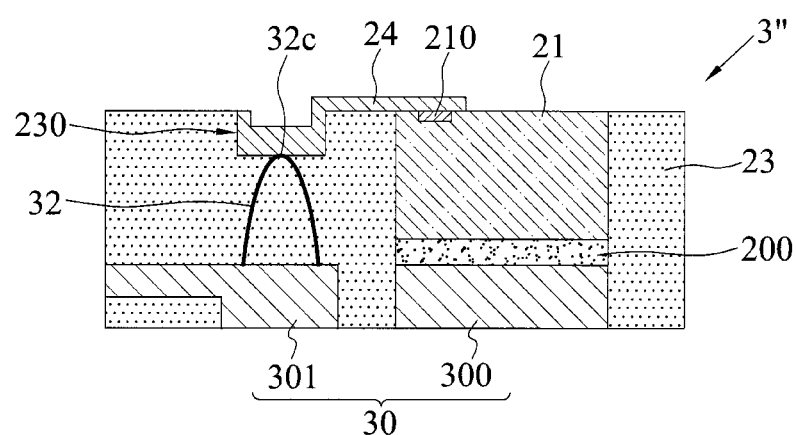

FIGS. 3B and 3C are schematic cross-sectional views of package structures 3', 3" according to other embodiments of the present disclosure. Referring to FIGS. 3B and 3C, the carrier 30 can be a lead frame having a die attach pad 300 and a plurality of leads 301. The electronic component 21 is disposed on the die attach pad 300 and the conductive elements 22 and 32 are disposed on the leads 301. The leads 301 can be exposed from the encapsulant 23 according to the practical need. In an embodiment, the exposed portions of the leads 301 can be notched (as shown in FIG. 3B) or flat (as shown in FIG. 3C).

The method according to the present disclosure can be performed through current packaging processes, thus dispensing with the conventional TSV-related processes such as a dry etching process and processes for forming an insulating layer and a photoresist layer. That is, the conventional TSVs are replaced with the conductive elements 22 and 32. Therefore, the present disclosure reduces the fabrication cost, shortens the fabrication time and improves the product yield.

Further, the conductive elements 22 and 32 and the conductive layer 24 can be fabricated by current equipment, thus reducing the fabrication cost.

In an embodiment, a portion of the surfaces of the conductive elements 22 and 32 can be flush with the second surface 23b of the encapsulant 23 so as to be exposed from the second surface 23b of the encapsulant 23.

The present disclosure further provides a package structure 2, 3, 3', 3", which has: a carrier 20, 30; an electronic component 21 disposed on the carrier 20 and having a sensing surface 21a; at least one conductive element 22, 32 disposed on and electrically connected to the carrier 20; an encapsulant 23 formed on the carrier 20 to encapsulate the electronic component 21 and the conductive element 22, 32, wherein the sensing surface 21a of the electronic component 21 and a portion of a surface of the conductive element 22, 32 (an end 22b or a loop top 32c) are exposed from the encapsulant 23; and a conductive layer 24 formed on the encapsulant 23 for electrically connecting the conductive element 22, 32 and the electronic component 21.

In an embodiment, the carrier 20, 30 is a circuit board or a lead frame.

In an embodiment, the electronic component 21 is a fingerprint identification chip.

In an embodiment, the conductive element 22, 32 is a loop-type bonding wire or wire segment.

In an embodiment, an opening 230 is formed in the encapsulant 23 to expose the portion of the surface of the conductive element 22, 32.

In an embodiment, the electronic component 21, the conductive element 22, 32 and the encapsulant 23 are positioned on one side of the carrier 20, and a plurality of conductive pads 202 are formed on the opposite side of the carrier 20.

Therefore, since the conventional TSV is replaced with the conductive element, the present disclosure fabricates the package structure through current packaging processes, dispensing with the conventional TSV-related processes. As such, the present disclosure reduces the fabrication cost, shortens the fabrication time and improves the product yield.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A package structure, comprising:
a carrier being a circuit board;
an electronic component disposed on the circuit board and having a sensing surface;
at least one conductive element disposed on the circuit board, wherein the conductive element is a bonding wire segment or a loop-type bonding wire;
an encapsulant formed on the carrier and encapsulating the electronic component and the conductive element, with the sensing surface of the electronic component and a portion of a surface of the conductive element exposed from the encapsulant; and
a conductive layer formed on the encapsulant and electrically connecting the conductive element and the electronic component.

2. The package structure of claim 1, wherein the electronic component is a fingerprint identification chip.

3. The package structure of claim 1, wherein the conductive element is electrically connected to the carrier.

4. The package structure of claim 1, further comprising an opening formed in the encapsulant to expose the portion of the surface of the conductive element.

5. The package structure of claim 1, further comprising a plurality of conductive pads disposed on one side of the circuit board.

6. The package structure of claim 5, wherein the electronic component, the conductive element and the encapsulant are disposed on the other opposite side of the circuit board.

7. A package structure, comprising:
a lead frame having a die attach pad and a plurality of leads;
an electronic component disposed on the die attach pad and having a sensing surface;
at least one conductive element disposed on the leads, wherein the conductive element is a bonding wire segment or a loop-type bonding wire;
an encapsulant formed on the lead frame and encapsulating the electronic component and the conductive element, with the sensing surface of the electronic component and a portion of a surface of the conductive element exposed from the encapsulant; and
a conductive layer formed on the encapsulant and electrically connecting the conductive element and the electronic component.

8. The package structure of claim 7, wherein the electronic component is a fingerprint identification chip.

9. The package structure of claim 7, wherein the conductive element is electrically connected to the leads.

10. The package structure of claim 7, further comprising an opening formed in the encapsulant to expose the portion of the surface of the conductive element.

* * * * *